United States Patent [19]

Greubel et al.

[11] 4,260,219
[45] Apr. 7, 1981

[54] DEVICE FOR COLLECTING LIGHT AND METHOD OF MANUFACTURING SUCH DEVICE

[75] Inventors: Waldemar Greubel; Ferdinand Quella, both of Munich, Fed. Rep. of Germany

[73] Assignee: Siemens Aktiengesellschaft, Berlin & Munich, Fed. Rep. of Germany

[21] Appl. No.: 62,784

[22] Filed: Aug. 1, 1979

[30] Foreign Application Priority Data

Aug. 2, 1978 [DE] Fed. Rep. of Germany ....... 2833934

[51] Int. Cl.³ .......................... H01L 31/00; G02B 5/14
[52] U.S. Cl. .................................... 350/96.10; 136/247
[58] Field of Search ...................... 350/96.10; 250/227; 252/301.35, 301.36; 136/247, 248, 256

[56] References Cited

FOREIGN PATENT DOCUMENTS 2554226 8/1977 Fed. Rep. of Germany.
2620115 10/1977 Fed. Rep. of Germany.
2742899 10/1978 Fed. Rep. of Germany.
2724748 12/1978 Fed. Rep. of Germany.

OTHER PUBLICATIONS

Von E. Lippert, Z für Elektrochem. Ber Bunsens Ges, Phys. Chem., vol. 61, pp. 962-975, 1957.
Mauer, et al., Fluorescent Collector for Solar Energy Collection, Research Disclosure, No. 129, 1975.
Goetzberger et al., Solar Energy Conversion with Fluorescent Collectors, 1977, pp. 123-129.
Greubel, das Fluoreszenz-Aktivierte Display, Elektronik, vol. 6, 1977, pp. 55-56.
Keil, Design Principles of Flourescence Radiation Converters, Nuclear Instruments and Methods, vol. 87, pp. 111-123, 1970.

Primary Examiner—John K. Corbin
Assistant Examiner—Rodney B. Bovernick
Attorney, Agent, or Firm—Hill, Van Santen, Steadman, Chiara & Simpson

[57] ABSTRACT

A light-collecting device in the form of, for example, a rectangularly-shaped body having a so-called "fluorescent plate" with at least one light-exit window is comprised of a solid polymerized synthetic carrier material, such as a polyacrylate, a polymethacrylate, polystyrene or copolymer of a methacrylate and a styrene, containing fluorescing particles therein which have finite dipole moments with different values in the basic and in the excited state and containing an amphiphilic additive, such as an ionoic or non-ionoic or polymeric soap, with such amphiphilic additive being colloidally dissolved in the synthetic carrier in such a manner that the fluorescing particles are each surrounded by one of the colloid particles and an environment with an orientation polarization is attained whereby the environment can re-orientate so quickly that it achieves its thermodynamic equilibrium substantially completely during the existence of the excited state in the fluorescing particles and tends to suppress the disruptive self-absorption of a light within the fluorescent plate. Such self-absorption originates from a partial overlap of the emission spectrum with the absorption spectrum of the fluorescing particles. In certain embodiments of the invention, an additional polar solvent for the fluorescing particles is also enclosed in the colloid particles. The amphiphilic additive and/or polar solvents can be admixed in the synthetic carrier material and the so-attained system can be cast into a desired body form. The disclosed device is useful as a solar collector, an optical indicia transmitter of an image brightener for passive displays.

22 Claims, 1 Drawing Figure

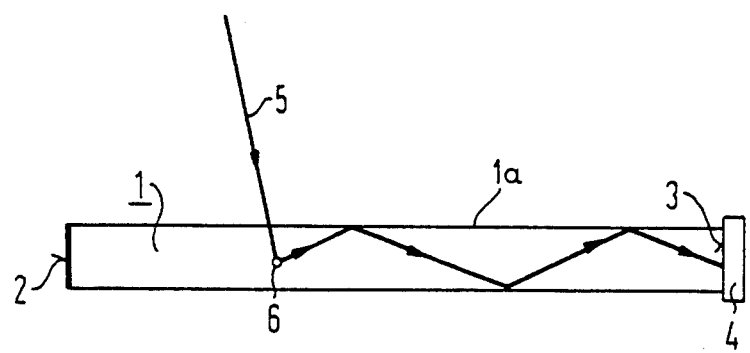

DEVICE FOR COLLECTING LIGHT AND METHOD OF MANUFACTURING SUCH DEVICE

BACKGROUND OF THE INVENTION

1. Field of the Invention

The invention relates to a device for concentrating radiant energy and somewhat more particularly to a device for collecting light and a method of producing such a device.

2. Prior Art

Devices for collecting light having, for example, a plate-shaped body (sometimes referred to as a "fluorescent" plate or body) functioning as a light trap having at least one light-exit window and comprised of a solid polymerized synthetic material having fluorescent particles therein are known in numerous embodiments and are useful, for example, for concentrating and collecting solar energy [P. B. Mauer and G. T. Turechek, Research Disclosure Vol. 129, paragraph 12930 (1975); German Offenlegungsschrift No. 2,620,115 (generally corresponding to U.S. Pat. No. 4,110,123); or A. Goetzberger and W. Greubel, Applied Physics, Vol. 14, pages 123-139 (1977)], for optical indicia transmission (G. Baur et al, U.S. Ser. No. 932,569 filed Aug. 10, 1978), for image brightening of passive displays [German Offenlegungsschrift 2,554,226 (generally corresponding to U.S. Pat. No. 4,142,781) or W. Greubel and G. Baur, Elektronik Vol. 6, pages 55-56, (1977)], or for increasing the sensitivity of scintiliators [G. Keil, Nuclear Instruments and Methods, Vol. 87, pages 111-123, (1970)].

In such devices, when light strikes a fluorescent plate, the light spectrum portion which is in the excitation spectrum of the fluorescent particles within the plate is absorbed by the fluorescent centers and the remaining portion of the light spectrum permeates the fluorescent plate without disturbance. The so-absorbed radiation, shifted toward longer wavelengths and spatially undirected, is re-emitted from the fluorescent centers. By far the greatest proportion of this fluorescent light is piped in the interior of the fluorescent plate via total reflections on the plate interfaces until it emerges at specific output areas with an increased intensity.

The efficiency achieved with presently available fluorescent plate still lags significantly behind theoretically possible values, primarily because the emission spectrum overlaps the absorption spectrum so that the fluorescent radiation in the plate has a finite absorption length. This "self-absorption" is particularly unsatisfactory with fluorescent bodies having a large collecting surface.

Workers in the field are aware that many organic fluorescent materials cause a shift of the emission spectrum toward lower frequencies, relative to the excited spectrum, when such materials are dissolved in a liquid having a strongly orientating polarization effect, i.e., a so-called red shift. Such red shift occurs when a fluorescent molecule has different dipole moments, in its basic and excited state and the environment about such particle or molecule (which remains unchanged during the absorption process) can re-orientate during the existence of the excited state [see E. Lippert, Zeitschrift der Elektrochem. Ber. Bunsengesellschaft Phys. Chem., Vol. 61, pages 962-975, (1975)].

Fluorescent bodies are preferably comprised of a solid carrier material. Such solid carriers, particularly when they are synthetic organic materials, can be readily manufactured and processed with relatively low economic outlays, which is a very significant advantage, particularly in mass production.

That a desired spectrum band separation also depends on the dielectric constant of a solvent in solid body solution and consequently the dipole differences in the basic and excited state plays an important role is suggested by the earlier cited Goetzberger and Greubel article in Applied Physics, Vol. 14, (1977), (cf. Section 3.3 therein). However, knowledge of how the suggested interrelationships might allow one to attain solid fluorescent bodies from synthetic base materials with necessary polarization properties is still absent. Above all the art still lacks knowledge of how to proceed so that a polar synthetic material can satisfy the requirements of fluorescent bodies. A fluorescent body, as is known, should be highly transparent and be thermally and photochemically stabile, should be readily formable into any desired body form, should be of sufficient hardness and form stability to provide a useful device and should have a relatively high fluorescent quantum yield.

SUMMARY OF THE INVENTION

In accordance with the principles of the invention, a device for collecting light is provided so as to comprise a body formed of a solid polymerized synthetic carrier material having fluorescent particles therein which exhibit finite dipole moments with different values in a basic and excited state of such particles and have an amphiphilic additive collodially dissolved within the synthetic carrier material so as to enclose each of the fluorescent particles with a collod particle and attain an environment with an orientation polarization whereby the environment can re-orientate itself so quickly that it achieves its thermodynamic equilibrium substantially completely during the existence of the excited state in the fluorescent particles.

In certain preferred embodiments of the invention, the amphiphilic additive is a polar material. In certain preferred embodiments of the invention, an additional polar solvent for the fluorescent particles is admixed with the synthetic carrier material and is enclosed with the collod particles. Such polar solvent is a relatively high boiling alcohol, for example, a glycol. The amphiphilic additive can be ionic, non-ionic or a polymeric soaps, such as a polyethylene sorbitan monolaurate or a polyvinyl pyrrolidone or a polymethacrylic acid and salts thereof. The synthetic carrier materials useful in the practice of the invention are selected from the group consisting of a polyacrylate, a polymethacrylate, a polystyrene and a copolymer with a methacrylate and a styrene as main components. The carrier material can be polymerized and can contain a non-oxidizing polymerization and/or cross-linkage initiator, such as a tetraphenyl ethane, for example a benzopinacol. The amount of amphiphilic additive, and polar solvent in those embodiments where such solvent is utilized, ranges between about 1 to 10 weight percent, based on the total weight of the fluorescent body.

In certain process embodiments of the invention, the light-collecting device of the invention is manufactured or produced by admixing the fluorescent particles (which in certain embodiments can be pre-dissolved in a polar solvent) and at least one select amphiphilic additive with a select synthetic carrier material existing in liquid form and thereafter forming a desired body from the resultant material mixture and stabilizing such body form. The select synthetic material can initially be in a monomer capable of being polymerized into a solid phase and such monomeric material is useful during the admixing step. The select synthetic material can also initially exist as an uncross-linked polymer or be in a pre-polymerized form. The attained material mixture can be formed into a desired body form by casting such mixture into a final body shape and stabilization of such shape can occur via a polymerization or a cross-linking reaction aided by a non-oxidizing initiator.

By following the principles of the invention one attains a fluorescent body which is characterized by a noticeably lower self-absorption of light in comparison to prior art bodies of this type, and which otherwise has similar good properties.

During the development of the invention, it was determined that a desired red shift would also have to occur if only the immediate neighboring molecules adjacent individual fluorescent molecules were polar and mobile. Such an arrangement was attained by utilizing polar liquids which spontaneously formed a shell around each fluorescent center and embedding such shells in a carrier medium in such a manner that a solid emulsion was attained. Such a system is particularly advantageous because relatively small amounts of the polar liquid are required so that substantially no compatibility problems arise.

In liquid solutions the art is aware that amphiphilic molecules (i.e., molecules having a hydrophilic or polar end and a lipophilic or un-polar end) form characteristic ball-shaped colloids, so-called micells, in a medium which is only hydrophilic or only lipophilic [cf. in this regard, for example, Winsor, Chemical Review, Vol. 68, pages 1–40, (1968)]. Such characteristic particles are held together via secondary valencies, cohesion forces and/or van der Waals forces and are stabile in specific temperature and concentration ranges when the system is in thermal equilibrium. One of the best known examples is aqueous soaps solutions. In such solutions, the polar ends of the soap molecules face the water molecules, whereas the un-polar ends of the soap molecules are directed toward the interior of the micell.

Experiments conducted during the development of the invention demonstrated that when fluorescent materials were added into a micellar solution, the individual fluorescent molecules were each surrounded or encased with a micell shell. It was also demonstrated that when such micells were introduced into organic synthetic carrier materials, the liquid characteristics of such colloids was retained.

Amphiphilic compounds often have no pronounced polarity. In such instances, a highly-polar solvent for the fluorescent material can be added since this does not prevent the formation of micell and such solvent is encased within the micell together, with the fluorescent molecules.

BRIEF DESCRIPTION OF THE DRAWINGS

The single drawing is a somewhat schematic elevational view of an exemplary embodiment of a light-collecting device produced and operating in accordance with the principles of the invention.

DESCRIPTION OF THE PREFERRED EMBODIMENTS

The invention provides a device for collecting light and a method of producing such a device.

In accordance with the principles of the invention, a device for collecting light is comprised of a body, preferably a rectangular plate-shaped body (i.e., a "fluorescent body") functioning as a light trap and having at least one light exit window. Such a body is comprised of a solid polymerized synthetic carrier material having an index of refraction greater than 1 and having substantially uniformly dispersed therein fluorescent particles having finite dipole moments with different values in a basic or rest state and in an excited state in such particles, along with at least one amphiphilic additive collodially dissolved within the synthetic carrier material in such a manner that the fluorescent particles are each enclosed by a collod particle and are each positioned in an environment with an orientation polarization whereby the environment can re-orientate so quickly that it attains its thermodynamic equilibrium substantially completely during the existence of the excited state in the fluorescent particles.

Such a light collecting device is illustrated in the drawing, which can be useful as a solar collector, an optical indicia transmitter or an image brightener for passive displays. Such a device includes a fluorescent plate 1 of a generally rectangular shape having a reflective layer 2 on three of its four narrow sides and is provided with a solar cell 4 on its fourth narrow side, which is a light-exit window 3. In the drawing a typical path of a sunbeam lying in the excitation spectrum of the fluorescent particles is shown penetrating a major plane surface 1a of plate 1. As the beam penetrates into the plate 1, it is absorbed by a fluorescent center 6 and re-emitted and conducted or piped via total reflection through the body of plate 1 to the exit window 3 onto the solar cell 4.

The synthetic carrier material utilized in the practice of the invention can be selected from the group consisting of a polyacrylate, a polymethacrylate, a polystyrol, copolymers with a methacrylate and as stryrene as main components and other like synthetic carrier materials, which can be branched or straight-chained and can exist in monomeric or pre-polymerized form and which are readily polymerizable into a solid polymerized body.

The amphiphilic additives utilized in the practice of the invention are generally soaps and can be ionic, non-ionic or polymeric soaps. Exemplary soaps include polyethylene sorbitan monolaurate, polyvinyl pyrrolidone, polymethacrylic acid and salts thereof. Of course conventional soaps may also be utilized. The polymeric soaps create a polar environment for the fluorescent particle and in specific embodiments, the use of a polymeric soap renders the use of a polar solvent superfluous. However, in other embodiments a polar solvent, such as a relatively high boiling alcohol, i.e., a glycol, may be utilized. As indicated earlier, the amount of an amphiphilic additive and optionally present polar solvent in a fluorescent body is relatively low and preferably ranges between about 1 to 10 weight percent, based on the total weight of the fluorescent body.

The fluorescent body of a light-collecting device of the invention can be produced via various methods. In a preferred method, the fluorescent particles are first optionally dissolved in a polar solvent, such as a high boiling alcohol, and then admixed into a synthetic carrier material, together with an amphiphilic additive. During the mixing process, the synthetic carrier material must be a liquid and the mixing must occur at a controlled temperature, generally about 100° C., which cannot be exceeded without destroying the micells. The so-attained material mixture is then brought or formed into a desired final body shape and thereafter hardened in accordance with known processes via polarization or cross-linkage reactions aided by non-oxidizing initiators, such as a tetraphenyl ester.

The synthetic carrier materials useful in the practice of the invention are typically liquids as monomer (for example methylmethacrylate), as an uncross-linked polymer (for example an unsaturated polyester resin) or in a pre-polymerized form. Such liquid form of the synthetic carrier material can, after addition of the amphiphilic additive and/or a polar solvent, be hardened by polarization or cross-linkage reactions.

The formation of a final body shape preferably takes place via a casting process since in such a process relatively low temperatures can be utilized.

Generally, fluorescent materials are very sensitive to oxidation and in order to avoid such, it is preferable to utilize polymerization initiators which function in a non-oxidizing manner. Such polymerization initiators can be selected from the tetraphenyl ethanes series, for example benzopinacol. In embodiments wherein a casting resin (for example an unsaturated polyester resin) is utilized, the earlier described amphiphilic additives, for example polyethylene sorbitan monolaurate, can be utilized, and such material mixture can be hardened via a non-oxidizing initiator during a polarization or a cross-linkage reaction.

This invention is not limited to the exemplary embodiment described in detail herein. In particular, the fluorescent body can be in a form other than strictly plate-shaped as long as the light trap effect on a basis of total internal reflection is retained. Suitable body embodiments, for example, are disclosed in co-pending U.S. Ser. No. 909,553 filed May 25, 1978, which is incorporated herein by reference.

Further, as used herein the term "colloid" is not limited to a narrow technical definition which, as is known, describes specific particle sizes. A selected micell diameter depends on a series of marginal conditions and should be noticeably smaller than a light wavelength so that no light scattering occurs at the micells.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A device for collecting light comprised of a body functioning as a light trap and having at least one light exit window, said body being comprised of a solid synthetic carrier material having an index of refraction greater than one and containing therein substantially uniformly dispersed fluorescent particles which have finite dipole moments with different values in the basic state and in the excited state of said particles and an amount of at least one amphiphilic additive colloidally dissolved in said synthetic carrier material in such a manner that each fluorescent particle is enclosed by a colloidal particle and are positioned in an environment with an orientation polarization whereby the environment can re-orientate so quickly that it achieves its thermodynamic equilibrium substantially completely during the existence of the excited state in the fluorescent particle.

2. A device as defined in claim 1 wherein said amphiphilic additive is a polar material.

3. A device as defined in claim 1 wherein said amphiphilic additive is a soap selected from the group consisting of an ionic, a non-ionic and a polymeric soap.

4. A device as defined in claim 3 wherein said soap is polyethylene sorbitan monolaurate.

5. A device as defined in claim 3 wherein said soap is selected from the group consisting of polyvinyl pyrrolidone, polymethacrylic acid and salts thereof.

6. A device as defined in claim 1 wherein a polar solvent for the fluorescent particles is enclosed in the individual colloid particles.

7. A device as defined in claim 6 wherein said polar solvent is a relatively high boiling alcohol.

8. In a device as defined in claim 7 wherein said alcohol is a glycol.

9. In a device as defined in claim 1 wherein said synthetic carrier material is selected from the group consisting of a polyacrylate, a polymethacrylate and a polystrene.

10. A device as defined in claim 1 wherein said synthetic carrier material is a copolymer with a methacrylate and a styrene as main components.

11. A device as defined in claim 1 wherein said synthetic carrier material includes a non-oxidizing polymerization initiator.

12. A device as defined in claim 11 wherein said initiator is a tetraphenyl ethane.

13. A device as defined in claim 12 wherein said tetraphenyl ethane is benzopinacol.

14. A device as defined in claim 1 wherein the amount of amphiphilic additive in the synthetic carrier material ranges between about 1 and 10 weight % on the basis of the total weight of the entire fluorescent body.

15. A device as defined in claim 6 wherein the amount of additive and polar solvent in the synthetic carrier material ranges between about 1 and 10 weight % on the basis of the total weight of the entire fluorescent body.

16. The device of claim 1 manufactured by a process wherein said fluorescent particles, which are dissolved in a polar solvent, and the amphiphilic additives are mixed with a select synthetic carrier material existing in liquid form and then the resultant material mixture is brought into a desired final body shape and stabilized.

17. The device as defined in claim 16 wherein said synthetic carrier material existing in liquid form is a monomer.

18. The device as defined in claim 16 wherein said synthetic carrier material existing in liquid form is a uncross-linked polymer.

19. The device as defined in claim 16 wherein said synthetic carrier material existing in liquid form is a pre-polymerized material.

20. The device as defined in claim 16 wherein the material mixture is brought into a desired final body shape via casting and is stabilized via a polymerization reaction initiated by a non-oxidizing polymerization initiator.

21. The device as defined in claim 16 wherein the material mixture is brought into a desired final body shape via casting and is stabilized via cross-linkage reaction initiated by a non-oxidizing cross-linking initiator.

22. A device as defined in claim 1 wherein said synthetic carrier material is polymerized.

* * * * *